(12) United States Patent
Nunnally

(10) Patent No.: US 6,665,468 B2
(45) Date of Patent: Dec. 16, 2003

(54) FOCAL PLANE ARRAY OPTICAL DATA EXTRACTION AND MEMORY

(75) Inventor: William C. Nunnally, Columbia, MO (US)

(73) Assignee: The Curators of the University of Missouri, Columbia, MO (US)

(*) Notice: Subject to any disclaimer, the term of this patent is extended or adjusted under 35 U.S.C. 154(b) by 0 days.

(21) Appl. No.: 10/135,887

(22) Filed: Apr. 30, 2002

(65) Prior Publication Data

US 2003/0202744 A1 Oct. 30, 2003

(51) Int. Cl.[7] .............................. G02B 6/42; H01J 40/14
(52) U.S. Cl. ........................ 385/30; 385/14; 385/129; 385/130; 385/131; 385/901; 250/208.1; 250/214 LA; 348/298
(58) Field of Search ............................. 385/30, 31, 14, 385/129, 130, 131, 132, 901, 33; 250/208.1, 214 LA; 348/298

(56) References Cited

U.S. PATENT DOCUMENTS

| | | | |
|---|---|---|---|
| 5,010,346 A | 4/1991 | Hamilton et al. | 341/137 |
| 5,039,988 A | 8/1991 | Hong | 341/137 |
| 5,326,996 A * | 7/1994 | McNutt | 257/229 |
| 5,585,624 A * | 12/1996 | Asatourian et al. | 250/216 |
| 5,665,959 A * | 9/1997 | Fossum et al. | 250/208.1 |
| 6,100,831 A | 8/2000 | Frankel | 341/137 |
| 6,118,397 A | 9/2000 | Heflinger | 341/137 |
| 6,175,678 B1 * | 1/2001 | Sanghera et al. | 385/116 |
| 6,188,342 B1 | 2/2001 | Gallo | 341/137 |
| 6,219,172 B1 | 4/2001 | Yariv | 359/264 |
| 6,246,350 B1 | 6/2001 | Yap | 341/137 |
| 6,275,255 B1 * | 8/2001 | Adair et al. | 348/76 |

FOREIGN PATENT DOCUMENTS

JP 2000 194024 7/2000 ............ 341/137 X

OTHER PUBLICATIONS

Wiener–Avnear et. al., "High–Density Pixel Array and Laser Micro–Milling . . ."U.S. patent application Publication No. U.S. 2001/0013510A1, published Aug. 16, 2001.*
Feld et. al., "Raman Endoscope", U.S. patent application Publication No. U.S. 2002/0156380A1, published Oct. 24, 2002.*

* cited by examiner

*Primary Examiner*—Brian Healy
(74) *Attorney, Agent, or Firm*—Greer, Burns & Crain, Ltd.

(57) ABSTRACT

The charge of pixels in a FPA array is retrieved by propagating an optical wave through a waveguide to interact with pixel charges from the FPA. An optical detector receives an optical wave altered by the respective pixel charges as it travels. The optical wave is sensed after passing through the waveguide. In a preferred embodiment, separate waveguides interact separate optical waves with charge from FPA pixels. Information concerning the charge is obtained with separate optical waves in the separate waveguides. In a preferred example of an N×M array according to an embodiment of the invention, a complete frame of data includes only N+M data values. A direct memory is also provided, where the pixel charges are held by maintaining an electric field to the pixels making the charge retrievable by an optical wave multiple times until the electric field is removed or reduced.

30 Claims, 6 Drawing Sheets

FOCAL PLANE ARRAY OPTICAL DATA EXTRACTION AND MEMORY

FIELD OF THE INVENTION

The invention concerns optical detector arrays, also known as focal plane arrays (FPAs).

BACKGROUND OF THE INVENTION

The conversion of optical signals into electrical signals forms the basis for a wide range of useful functions. A focal plane array (FPA) is a semiconductor device that converts light impingent upon it into electrical charge. The optically generated electrical charge is collected at localized areas or pixels of the image focal plane. The pixels are arranged in N rows and M columns to form an N by M array. A CID (charge injected device) is one type of FPA used to convert optical signals to electrical signals. Another type of FPA device is a charge-coupled device (CCD), which is the most common type of an FPA. CCD's were commercially brought to use in television cameras. Their use has since grown significantly. Exemplary applications of CCDs include security systems, scanners, cameras, fax machines, telescopes, machine vision systems and a wide range of imaging systems. Other FPA devices have a similar wide-ranging applicability.

CCD (and other FPA) devices may be silicon devices, while the modern trend is toward MOS (metal oxide semiconductor devices). CID devices inject a charge into an underlying semiconductor and that charge may be individually addressed and read out. A CCD device is another embodiment of an FPA in which the electronic charge collected in each pixel coupled to the adjacent pixel charge. The charge in each pixel is transferred to the edge of the array by shifting the charge along a row of column of the array where it is converted to a voltage. The individual pixel charge is coupled or moved to the edge of the device using voltages on a number of conductors that span the FPA in a manner similar to shifting data in a shift array. The array of pixels, i.e., individual picture elements, is typically formed from MOS (metal oxide semiconductor) capacitors. A typical pixel is in the range of 10 to 20 $\mu$m square. As the underlying semiconductor devices become smaller, similar reductions in the pixel size of CCDs and other FPAs is possible. Arrays of the MOS capacitors are created on a substrate to form a typical CCD device. When a photon of sufficient energy strikes the depletion region of a MOS capacitor, it is absorbed and causes an accumulation of charge carriers, typically electrons, at the oxide-semiconductor interface. Extracting this result permits the determination of the quantity and intensity of light striking an element in the array.

With the use of optical filters and particular arrangements of FPAs, the FPAs can also be used to determine the wavelength of impingent optical energy, allowing, for example, the detection of color in addition to the intensity and location of light striking a FPA array. Electronic techniques are used to extract data from FPAs. The speed of extraction and the memory requirements for extraction comprise two major limitations to the size and general applicability of FPA arrays.

The basic electronic method for reading data from a CCD array involves a sequential application of voltage to gates of the MOS capacitors to transfer electrons from gate to gate in shift register fashion. A typical configuration is called a three-phase CCD In a three-phase CCD, voltages on consecutive gates are controlled by three out-of-phase clock signals. A three stage process shifts the charge collected by one gate. The charge in each pixel is converted to a voltage as the charge reaches the edge of the array and the voltage is used as a measure of the light that was incident on an individual pixel. Repetition of this process many times completes transfer of one column of charge. For M columns, M repetitions are required. The overall speed of data retrieval therefore depends on the number of columns and the speed of the repetition that is required to shift the data to edge of the array. For example, retrieving data from common CCDs requires several milliseconds.

Other FPAs may be read out directly, i.e., they are charge collection devices instead of charge transfer devices. In such FPAs (including CIDs) individual pixels are accessed to determine their charge. For large FPAs or for applications requiring high speed data retrieval, the typical method for avoiding the step-wise column by column transfer of a CCD is to include a memory buffer arranged similarly to the FPA pixel array. The memory buffer accepts full frame input. Memory sizes can be quite large, however, adding expense and complexity. In addition, electronic access to large arrays of pixel data can also be slow compared to the potential for the rapid change in optical energy impingent upon the FPA.

SUMMARY OF THE INVENTION

According to an aspect of the invention, the charge of pixels in a FPA array is sampled by propagating an optical wave along a waveguide positioned to enable the evanescent electric field of the optical wave to interact with the pixel charges. An optical detector receives an optical wave altered by the respective pixel charges after the wave has traversed the array along a column or row.

In another aspect of the invention, an electric field is used to hold and release pixel charges. A direct optical memory is thereby realized. Pixel charge is held while an electric field maintains the separation of electron-hole pairs resultant from impingent optical energy upon pixels while under influence of the applied electric field. By maintaining the electric field, the pixel charges in an array may be kept and sampled numerous times. The memory is cleared when the applied electric field is reduced or removed.

DETAILED DESCRIPTION OF THE INVENTION

The present invention optically extracts charge from an FPA array. An optical wave is propagated through a waveguide that interacts the wave with charges in pixels of the FPA array. The optical wave is detected after passing through the waveguide. Information concerning pixel data is retrievable from the detected optical wave. With preferred detection and analysis techniques, the present invention may be applied to create very fast FPA devices. The invention may also be applied to reduce memory dependency. For example, a two-dimensional embodiment of the invention for an N×M pixel array requires storage of only N+M data points for a complete frame of data. Charge in a pixel array may also be maintained through a continued application of an electric field, negating the need for any separate electronic memory in certain applications. This embodiment forms a direct memory, where pixel charges may be extracted multiple times. The memory is cleared upon reduction or removal of the electric field.

Figure 1:
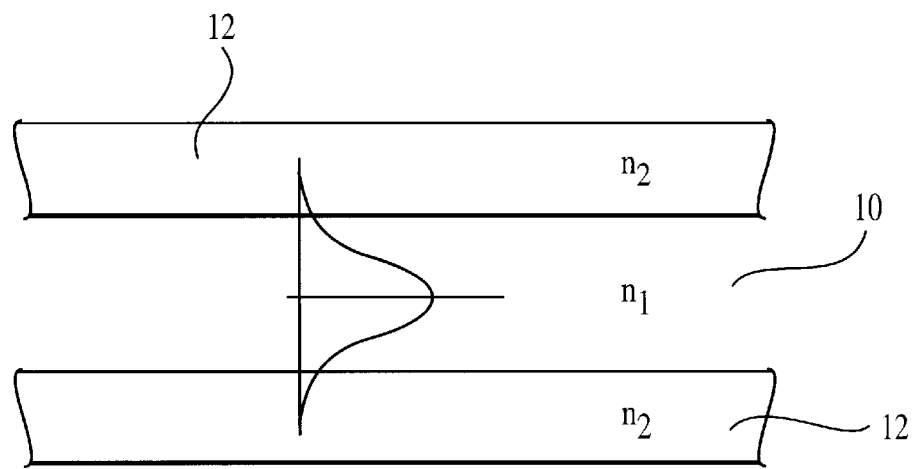
FIG. 1 is a schematic illustration of the electric field distribution for optical energy traveling along a single mode optical waveguide.

In a preferred embodiment, separate waveguides interact with the charge along each row and column of pixels. Information concerning the charge is obtained with separate optical waves in the separate waveguides. A separate optical waveguide is used to sample each row on one side of the FPA. On the opposite side of the FPA, separate optical waveguides are employed to sample each column in the FPA. The row waveguides and the column waveguides on opposite sides of the FPA are orthogonal with respect to each other. An optical signal is injected into each row and column waveguide and received at the end of the waveguides. In this manner, the optical energy is transmitted across the FPA and sampled the around the perimeter. The received signals can then be used in concert with an algorithm, similar to Computer Aided Tomography or a CAT scan, to de-convolve the received data and determine the charge distribution that resulted in the signal alterations. The calculation is simplified as the conventional CAT algorithm handles data that is recorded as a function of multiple angles around the periphery of the target. In this embodiment, the data will be orthogonal, but other orientations of waveguides with the same image to be detected are possible. The received data is really a compact representation of the data in the FPA or memory and thus enables rapid transmission to another location before it is deconvolved. A principle relied upon by the invention concerns the electric field geometry of an optical waveguide. This is graphically represented in FIG. 1, which illustrates the electric field distribution for optical energy traveling along a single mode optical waveguide. The electric field is primarily in a waveguide core 10 (index of refraction $n_1$), but also extends into a waveguide cladding 12 (index of refraction $n_2$). This latter portion of the electric field is known as the evanescent field or evanescent wave, and resides in what may be called an evanescent region of the optical waveguide. A difference in the indices of refraction generally confines optical energy into the core, while $n_2 < n_1$ applies for efficient waveguide transmission. When the cladding is resistive due to the presence of charge in an adjacent layer, or the cladding index varies along the waveguide, optical energy may be lost.

Figure 2:
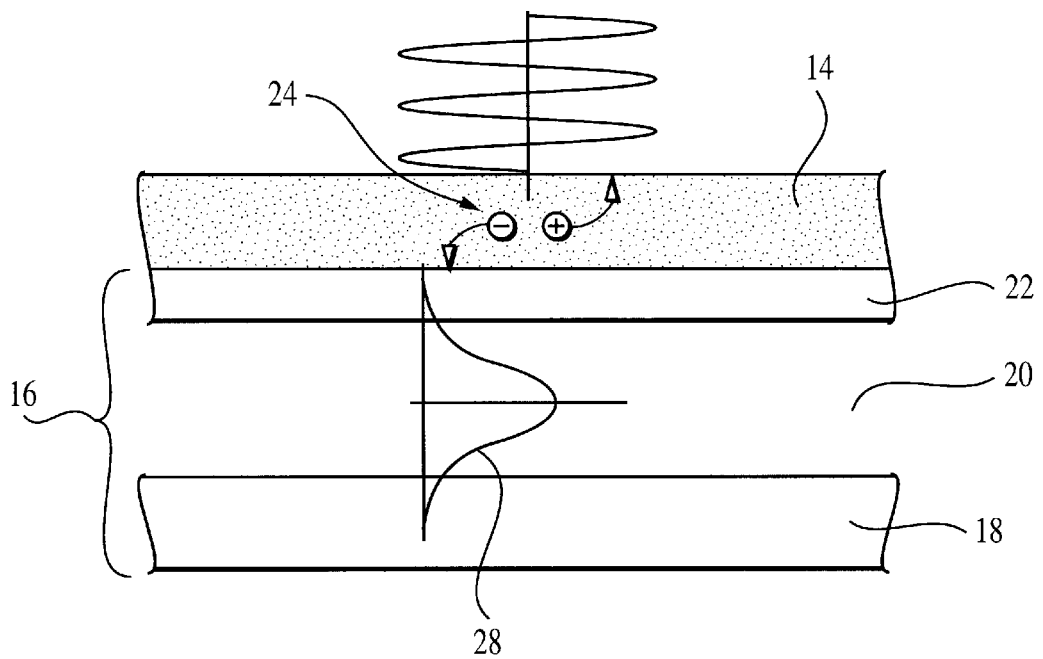
FIG. 2 is a schematic side partial cross section of a preferred embodiment FPA device of the invention.

Referring now to FIG. 2, a preferred embodiment of the invention is illustrated with a partial cross section. An FPA photoconductive element 14, i.e., pixel, is formed on an optical waveguide 16, including a cladding 18, a core 20 and a cladding/evanescent region 22. Optical energy of interest impinges on the pixel 14. This optical energy creates electron-hole pairs 24. The electron pairs separate in a background electric field when optical energy of an appropriate wavelength impinges upon the photosensitive pixel 14. An optical wave 28 propagating through the optical waveguide retrieves data relating to the quantity of pixel charge. The optical wave 28 interacts with the separated charges and is altered as a result. The cladding 22 next to the photo-conductive element 14 is sufficiently thin to enable the evanescent wave field of the optical pulse 28 to interact with the photo-conductive element 14. The more charge that is present, the higher the conductivity of the photo-conductive material. In the case of a low or no conductivity cladding, the index of refraction is dependent upon the free charge in the evanescent region of the optical waveguide.

Figure 3:
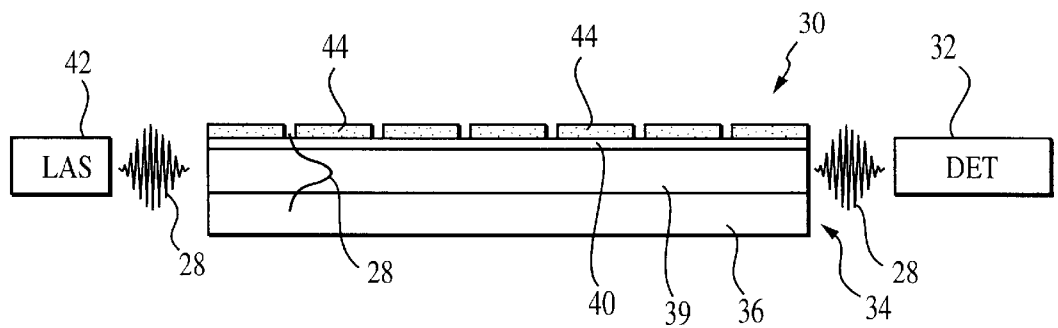
FIG. 3 is a schematic side view of a preferred embodiment multiple pixel FPA device.

As seen in FIG. 3, a schematic side view of a multiple pixel FPA device 30, a detector 32 detects the optical wave 28 after it passes through a waveguide 34, which includes a cladding 36, core 38, and cladding/evanescent region 40. A data quantity may be obtained, for example, by comparing the sensed optical wave to a reference optical wave (or reference wave data) corresponding to a state in which pixels are in a no charge state. The optical wave is initiated by an optical source, preferably a laser 42. Assume that FIG. 3 represents a linear array. In that case, the single direction light wave will be affected by each pixel 44 that has a charge as a result of separated electron/hole pairs. The exact effect of each pixel 44 may vary with the intensity of impingent energy upon the pixel. With a single optical wave in a single direction, the detector 32 can provide an amplitude indication that corresponds to the cumulative affect of CCD pixels 44. This may be useful in applications where further detail is not required. However, other applications will require the ability to differentiate between the charge stored at each pixel location. In a 1×M array, this simply would be accomplished by M light waves each traversing a separate pixel.

Figure 4:
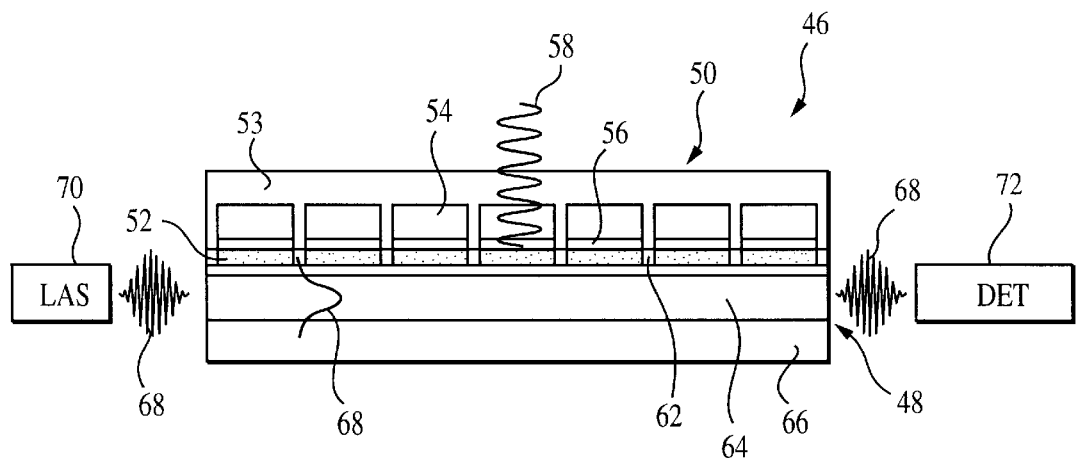
FIG. 4 illustrates the side view of a preferred embodiment FPA device structure.
Figure 5:
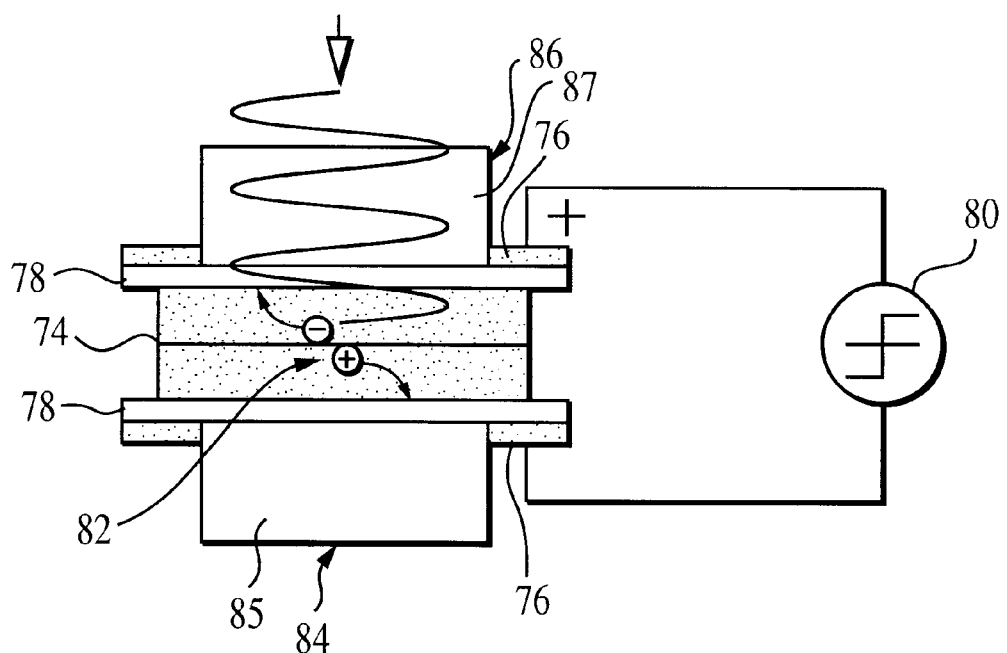
FIG. 5 is a schematic representation of the result of a pixel charge for a preferred embodiment FPA device pixel geometry.

A preferred embodiment for N×M arrays (N>1; M>1) is presented in FIGS. 4–6. FIG. 4 illustrates the side view of an FPA device structure 46 including bottom waveguides 48 and a top waveguides 50, which separately direct optical waves to interact with pixels of an FPA pixel array 52 disposed between the waveguides. The top waveguides 50 are orthogonal to the bottom waveguides 48. A common cladding 53 of the top waveguides 50 is seen as continuous in the section of FIG. 4, and completes separate top waveguides 50 with respective cores 54 and evanescent regions/claddings 56. One bottom waveguide is seen in FIG. 4 as the cross section is taken through its middle, but the bottom waveguides 48 are formed in a like fashion to the waveguides 50. "Top" and "bottom" are arbitrary and used only in reference to the orientation shown in the drawing. Similarly, the N×M designation chosen herein for purposes of illustration will refer to "rows" and "columns", again used as arbitrary interchangeable terms. Either of the top or bottom waveguides may be considered the row waveguide and the other the column waveguide. In FIG. 4, seven "top" waveguides are shown. In practice, there would normally be thousands of parallel top and bottom waveguides. Though incident radiation 58 impinges upon the FPA pixels 60 after passing through the top waveguides 50, the incident optical radiation may be passed through the bottom waveguides 48. The probe wavelength should be longer than the wavelength of the image generating charge in the FPA pixels. Otherwise, the probe pulse would generate charge in the FPA. For example, a long 1.55 micron wavelength as the probe wavelength will enable the FPA to operate at wavelengths below about 1 micron, which includes all visible wavelengths and the near infra-red. The optical energy producing charge in the FPA pixels will be transmitted through the waveguide core and cladding since it is incident perpendicular to the surface. Isolation regions 62 electrically isolate individual pixels from surrounding pixels. No circuitry or electrical relationship between pixels is required since the pixels will not pass charges in a step wise fashion as in a CCD device. Charge is passed to an evanescent region (cladding) 56 of the bottom waveguides 48, each of which also includes a core 64 and makes use of a common cladding 66 for the propagation and confinement of a "read" optical wave 69 from a laser 70. A detector 72 detects each optical wave 68 after it propagates through one of the bottom waveguides 48 and is altered as a result of interaction with electron/hole pairs resultant from impingent energy upon pixels. Assuming the bottom waveguides 48 to be for rows, there are N waveguides with N respective lasers 70 and N respective detectors 72. Unseen in the FIG. 4 view are M respective lasers and detectors for M waveguides 50. Referring to FIG. 5, a schematic representation of the result of a pixel charge is shown for a preferred embodiment pixel geometry.

In the preferred embodiment of FIG. 5, an FPA pixel is formed as a p-n junction 74. Electrodes 76, separated from the p-n junction by insulator layers 78, are stimulated by a voltage source 80 (or sources) to forward or reverse bias the p-n junction 74. The electrodes 76, as artisans will appreciate, may form part of one or more circuit interconnect patterns in a typical semiconductor circuit structure. Logic may be applied in any fashion to realize active and inactive regions of the FPA array, for example. Similarly, the p-n junction 74 or an intrinsic semiconductor substrate may be used as the photosensitive FPA pixel structure, the purpose of which is to produce electron/hole pairs 82. In the case of a reverse biased junction, electron hole pairs 82 are created in the electric field and migrate to the insulator 78 which is held at the respective opposite potential. Optical waves propagated through a bottom waveguide 84 and a top waveguide 86 are affected by the charge transfer as separated electron hole pairs accumulate at insulator (cladding) interfaces and interact with the optical waves In FIG. 5, for simplicity of illustration, the bottom waveguide 84 and top waveguide 86 are shown in parallel, whereas they are preferably orthogonal to allow analysis of individual pixel locations. Silicon dioxide and doped silicon dioxide are exemplary materials for the respective core and cladding of the waveguide, though other materials would be used for wavelengths that are incompatible with the silicon dioxide and doped silicon dioxide. Conventional MOS processes used in CCDs are suitable for formation.

Figure 6B:
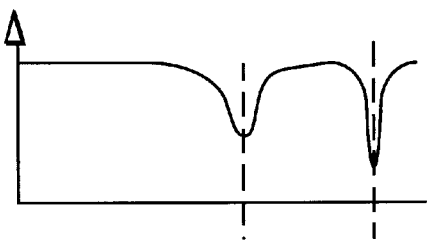
FIG. 6B is an exemplary data plot for an array of detectors of the FIG. 6a device.
Figure 6C:
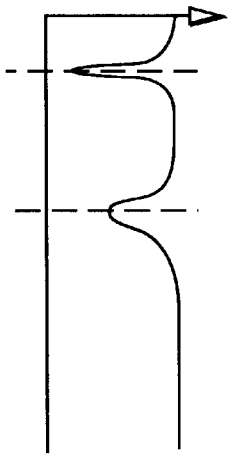
FIG. 6C is an exemplary data plot for another array of detectors of the FIG. 6a device.
Figure 6A:
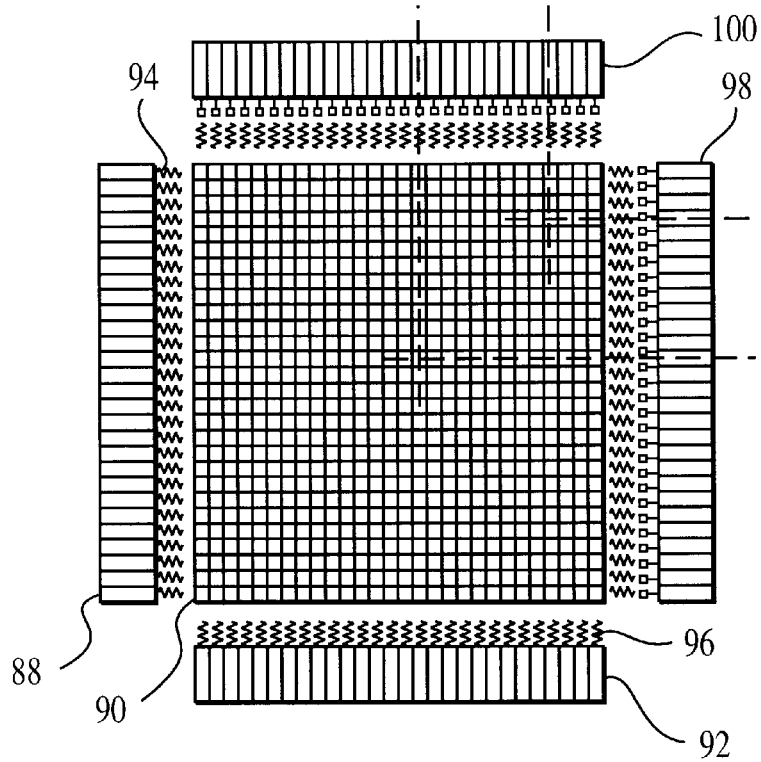
FIG. 6A is a block diagram of a preferred embodiment FPA array device of the invention.

The replication of the FIGS. 4 and 5 FPA is shown in the schematic representation of FIG. 6A. A row array of laser light sources 88 directs read optical waves into respective row waveguides in either the top or bottom waveguide structure of an FPA pixel array 90. A column array of light sources 92 directs read optical waves into respective column waveguides in the other of the top or bottom waveguide structure of the FPA pixel array 90. The array of row light sources 88 emit parallel optical waves 94 that are orthogonal to parallel optical waves 96 emitted from the column light sources 92. After the respective waves propagate through the top and bottom waveguide, they are detected by a respective row detector array of light detectors 98 and a column detector array of light detectors 100. The beams are altered depending upon the state of corresponding pixels in the FPA array 86. Data collected from the row detector array 98 and the column detector array 100 is sufficient to reconstruct information indicating the value of charge at individual pixels in the pixels in the FPA array 90.

Figure 7:
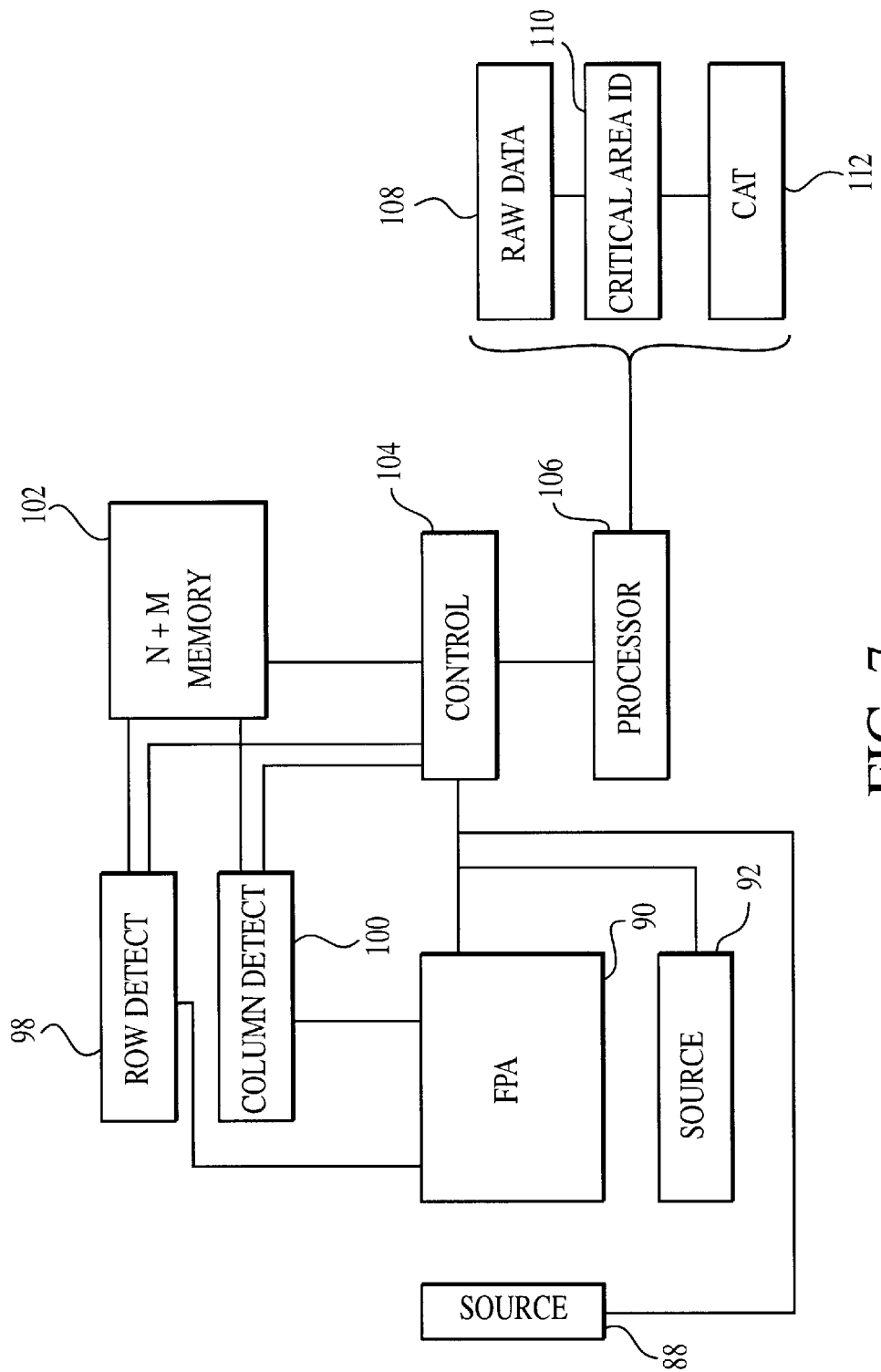
FIG. 7 is a block diagram of a preferred FPA device of the invention.

FIGS. 6B and 6C graphically represent a frame of information collected from the FPA array 90. In a preferred embodiment, this information is collected by an N+M frame memory 102, as shown in FIG. 7. The N+M data points constitute N amplitudes from N detectors of the row detector array 98 and M amplitudes from the column detector array 100. This information may be collected periodically according to a controller 104, which may form part of or be a separate from a processor 106. Various methods may be employed by the processor 106 to analyze a frame of data or multiple frames of data. A preferred process begins with a raw data scan 108 that can be used to rapidly determine critical areas 110 of the FPA array, for example, based upon a combined amplitude threshold for each pixel, or selected pattern of pixels, e.g. odd numbered pixels. Various image processing techniques may be employed for the raw data scan to determine critical areas. This step is optionally used to quickly identify regions for further analysis. A preferred further analysis is the application of a computer aided tomography (CAT) analysis 112 to the data. A CAT analysis may be used to determine the quantity of charge at each pixel in the FPA array 90.

Data obtained can be obtained from pixel array 90 in the time necessary to transmit optical waves through the waveguides and perform a CAT analysis of a frame of data. Critical areas of a received optical image can be identified quickly by the raw data scan 108. For example, if the FPA array 90 is looking at a particular wavelength, areas of the image being viewed where that wavelength originates can be determined and a CAT analysis performed only on those regions. Alternatively, those regions can be searched with a higher data resolution, for example, examining more pixels than used in the raw data scan 108.

As the invention can provide full frame information in N+M pixels, the memory expense and time consumption for frame analysis is reduced significantly from N*M. In a 4000×4000 pixel array, this reduces the required storage from 16 million data values to 8000 data values. With reasonable memory and computational expense, sophisticated analyses may be conducted. An example is the combination of frames of data from multiple FPA arrays, each viewing a different wavelength of the same image.

Figure 8:
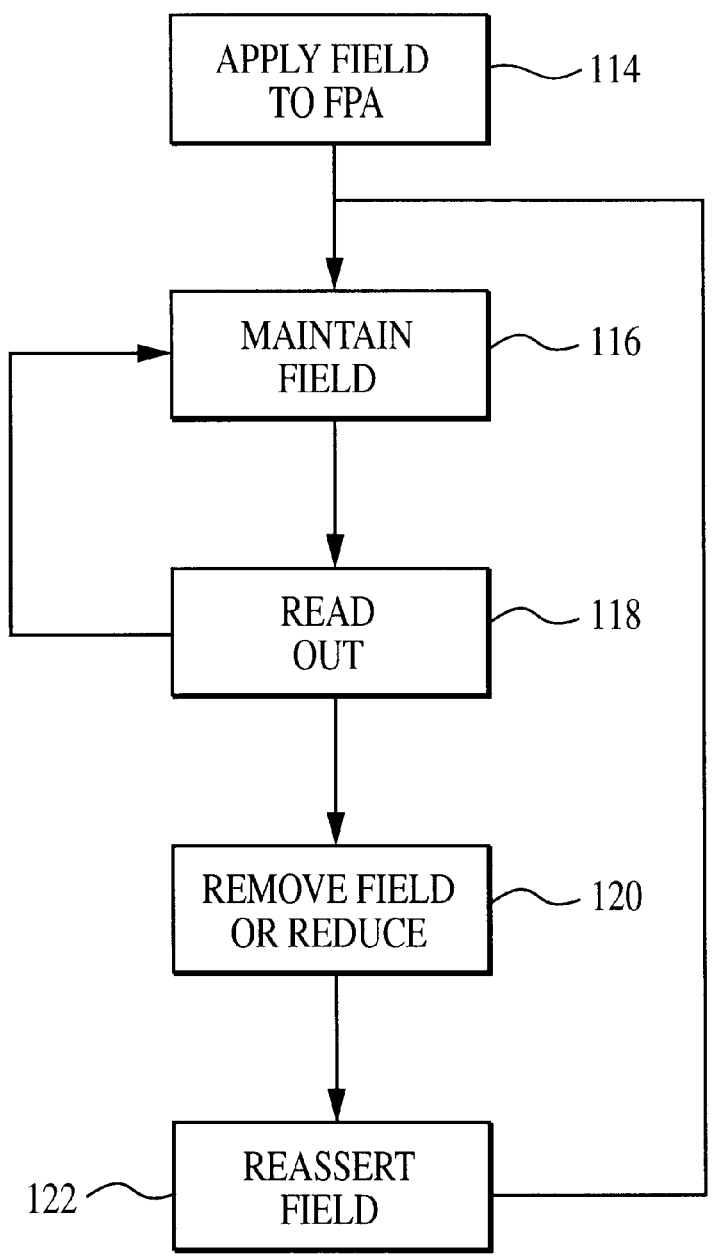
FIG. 8 is a block diagram of a preferred method to control an FPA device as a direct memory.

When the row light sources 88 and column light sources 92 are pulsed, a cyclic reading of the FPA array is obtained. Another option is to use the FPA array as a direct memory device due to the optical extraction afforded by the invention. A method for controlling the FPA array for direct memory use is shown in FIG. 8. The method is, for example, implemented by the controller 104, which might be program code in the processor 106. As discussed with respect to FIG. 5, electrodes 76 apply charge (step 114) to pixels to provide the electric field necessary to allow the separation of electron-hole pairs in response to impingent optical energy. In a preferred embodiment, the controller 104 controls the pixel electrodes and thereby controls the electric field. Separated electron/hole pairs, which result from impingent optical energy upon a pixel, will remain separated with the maintenance of an appropriate electric field (step 116). This is a form of direct storage in the FPA pixels. "Read" optical beams can be repetitively applied to read out (step 118) data stored in the FPA pixels. The data is cleared when the electric field is reduced (step 120) to a point to allow electron hole pairs to rejoin. A field is reasserted (step 122) to receive additional data. Unlike the electronic read techniques, the charge is not transferred or injected and will remain with the pixel until the electric field is reduced or removed.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A FPA array data retrieval method, the method comprising steps of:
   providing an optical waveguide proximate pixels in the FPA;
   propagating an optical wave through the optical waveguide to interact with charges of the pixels; and
   sensing the optical wave after it passes through the optical waveguide.

2. The method according to claim 1, further comprising a step of determining the data based upon a property of the optical wave as sensed in said step of sensing.

3. The method according to claim 2, wherein,
   said step of propagating comprises:
      propagating a row optical wave in a row optical waveguide to interact with charge in pixels of the FPA array;
      propagating a column optical wave in a column optical waveguide to interact with charge in pixels of the FPA array;
   said step of sensing comprises:
      sensing row optical wave;
      sensing said optical wave.

4. The method according to claim 3, wherein one of said row and column optical waves interacts with positive pixel charges and the other interacts with negative pixel charges.

5. The method according to claim 1, further comprising steps of, prior to said step of propagating:
   applying an electric field to said pixels to permit pixel charges to form in response to impingent optical energy; and
   maintaining formed pixel charges by continued application of the electric field.

6. The method according to claim 5, wherein said step of maintaining is continued after said step of propagating to store pixel charges.

7. The method according to claim 6, wherein said step of propagating is repeated to read pixel charges multiple times.

8. The method according to claim 6, further comprising a step of reducing the electric field to clear pixel charges.

9. A FPA device comprising:
   photosensitive FPA pixels; and
   an optical waveguide associated with said FPA pixels to permit interaction of an optical wave with charges in said FPA pixels.

10. The FPA device according to claim 9, further comprising:
    an optical wave source disposed to propagate an optical wave through said optical waveguide to interact with said pixel charges; and
    a sensor disposed to sense the optical wave after passing through said optical waveguide.

11. The FPA device according to claim 9, wherein said FPA pixels are formed upon said optical waveguide.

12. The FPA device according to claim 11, wherein said FPA pixels are formed upon an evanescent region of said optical waveguide.

13. The FPA device according to claim 11, further comprising a second waveguide formed upon said FPA pixels.

14. A FPA device comprising:
    an optical cladding;
    an optical core upon said cladding;
    an evanescent region upon said optical core; and
    FPA pixels upon said evanescent region.

15. The FPA device according to claim 14, further comprising:
    a second evanescent region upon said FPA pixels;
    a second core upon said second evanescent region; and
    a second cladding upon said second core.

16. A FPA device structure comprising:
    a bottom optical waveguide;
    a bottom insulator;
    a top insulator;
    p-n junction layers between said top insulator and said bottom insulator, said bottom insulator separating said p-n junction layers from said bottom optical waveguide;
    electrodes on said top insulator and said bottom insulator for biasing said p-n junction layers; and
    a top optical waveguide separate from said p-n junction layers by said top insulator.

17. A FPA device comprising:
    an N×M rectangular array of FPA pixels;
    N row waveguides disposed to respectively interact N optical waves with charge from N rows of pixels of said N×M rectangular of pixels;
    M column waveguides disposed to respectively interact M optical waves with charge from M columns of pixels of said N×M rectangular array of FPA pixels;
    N row light wave sources disposed to respectively propagate N light waves through said N row waveguides;
    N row light sensors to respectively sense said N light waves after said N light waves have passed through said N row waveguides;
    M column light sources disposed to respectively propagate M light waves through said M column waveguides;
    M column light sensors disposed to respectively sense said M light waves after said M light waves have passed through said M column waveguides.

18. The FPA device according to claim 17, wherein said N column and M row waveguides are separated from each other by said N×M rectangular array of pixels.

19. The FPA device according to claim 17, further comprising:
    a processor to process data from said N row light sensors and said M column light sensors; and
    a controller for controlling said N row light sources and said M column light sources.

20. The FPA device according to claim 17, further comprising a memory for receiving data from said N row light sensors and said M column light sensors.

21. The FPA device according to claim 20, wherein said memory stores a complete frame of data consisting of N+M data points.

22. The FPA device according to claim 21, further comprising a processor for analyzing said data.

23. The FPA device according to claim 22, wherein said processor initially conducts row amplitude analysis and a column amplitude analysis based upon amplitudes respectively corresponding to data from said N row sensors and said M column sensors.

24. The FPA device according to claim 23, wherein said processor selects a data region for further analysis based upon said row amplitude analysis and said column amplitude analysis.

25. The FPA device according to claim 24, wherein said further analysis comprises a computer aided tomography analysis of said data.

26. The FPA device according to claim 20, further comprising a processor for conducting a computer aided tomography analysis of said data.

27. The FPA device according to claim 17, wherein said N x M pixels include pixels responsive to multiple wavelengths of incident light.

28. An FPA direct memory device, comprising:
an array of FPA pixels;
means for applying an electric field to said FPA pixels;
optical wave sources providing read optical waves;
means for directing the read optical waves to interact with charges in said FPA pixels;
detectors to detect said optical waves; and
control means for controlling said means for applying, said optical wave sources, and said sensors to store, read and clear charges in said pixels.

29. The FPA direct memory device according to claim 28, wherein said control means controls said means for applying to apply an electric field to permit said pixels to store charges, controls said means for applying to maintain an electric field to permit the read optical waves to interact with pixel charges and thereby read pixel charges, and controls said means for applying to reduce or remove a maintained electric field to clear pixel charges.

30. An FPA device comprising:
two sets of optical waveguides being disposed orthogonally with respect to each other;
FPA pixels between said two sets of optical waveguides and located where an imaginary lines extending from ones of said pixels can intersect a waveguide from each of said two sets of optical waveguides.

* * * * *